United States Patent
Adams et al.

(10) Patent No.: US 9,183,906 B2
(45) Date of Patent: Nov. 10, 2015

(54) FINE GRANULARITY POWER GATING

(71) Applicant: International Business Machines Corporation, Armonk, NY (US)

(72) Inventors: Chad A. Adams, Byron, MN (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 509 days.

(21) Appl. No.: 13/633,217

(22) Filed: Oct. 2, 2012

(65) Prior Publication Data

US 2014/0092700 A1    Apr. 3, 2014

(51) Int. Cl.
*G11C 7/00* (2006.01)
*G11C 8/10* (2006.01)
*G11C 8/08* (2006.01)
*G11C 8/12* (2006.01)
*G11C 5/14* (2006.01)

(52) U.S. Cl.
CPC .. *G11C 8/10* (2013.01); *G11C 8/08* (2013.01); *G11C 8/12* (2013.01); *G11C 5/147* (2013.01)

(58) Field of Classification Search
CPC ....... G11C 5/147; G11C 5/14; G11C 11/4074
USPC ................. 365/226, 189.07, 189.06
See application file for complete search history.

(56) References Cited

U.S. PATENT DOCUMENTS

| | | |
|---|---|---|
| 5,263,002 A | 11/1993 | Suzuki et al. |
| 5,617,369 A | 4/1997 | Tomishima et al. |
| 5,668,770 A | 9/1997 | Itoh et al. |
| 5,729,498 A | 3/1998 | Yih et al. |
| 5,894,443 A | 4/1999 | Sagoh |
| 5,901,103 A | 5/1999 | Harris, II et al. |
| 6,108,255 A | 8/2000 | Ciraula et al. |
| 6,236,617 B1 | 5/2001 | Hsu et al. |
| 6,426,890 B1 | 7/2002 | Jasinski et al. |
| 6,724,648 B2 | 4/2004 | Khellah et al. |
| 6,898,110 B2 * | 5/2005 | Ishimatsu et al. ............. 365/149 |
| 7,061,794 B1 | 6/2006 | Sabharwal et al. |
| 7,408,829 B2 | 8/2008 | Kuang et al. |
| 7,447,098 B2 | 11/2008 | Tsukude |
| 7,489,584 B2 | 2/2009 | Dang et al. |
| 7,529,138 B2 * | 5/2009 | Park et al. ................ 365/185.29 |
| 7,692,964 B1 | 4/2010 | Sabharwal et al. |

(Continued)

OTHER PUBLICATIONS

Norman, Notice of Allowance and Fee(s) Due for U.S. Appl. No. 13/315,604 dated Aug. 8, 2013, 16pgs.

(Continued)

*Primary Examiner* — Connie Yoha
(74) *Attorney, Agent, or Firm* — David A. Cain; Hoffman Warnick LLC

(57) ABSTRACT

Rows of a memory array are segmented into a predetermined number of word line groups. Each row in a word line group has a word line disposed between parallel power supply lines. Each of the power supply lines in a row of a word line group is shared by an adjacent row in the word line group. A row on a boundary of a word line group has a power supply line shared by a row on a boundary of an adjacent word line group. All power supply lines in a word line group are at a full power voltage in response to one of the rows in the word line group being selected by a word line. Most power supply lines in an adjacent word line group are at a full power voltage. All power supply lines in other word line groups are at a power-gated voltage.

21 Claims, 4 Drawing Sheets

(56) References Cited

U.S. PATENT DOCUMENTS

| | | |
|---|---|---|
| 7,729,194 B2 | 6/2010 | Zanders |
| 7,835,212 B2 | 11/2010 | Kuang et al. |
| 2002/0003743 A1 | 1/2002 | Kunikiyo |
| 2003/0189849 A1 | 10/2003 | Khellah et al. |
| 2006/0028896 A1* | 2/2006 | Yamagami .................... 365/226 |
| 2006/0056266 A1* | 3/2006 | Kliewer et al. .......... 365/230.06 |
| 2011/0090753 A1 | 4/2011 | Lee et al. |
| 2012/0087198 A1 | 4/2012 | Nii et al. |
| 2013/0148455 A1* | 6/2013 | Houle et al. .................. 365/226 |

OTHER PUBLICATIONS

Hua et al., "Distributed Data-Retention Power Gating Techniques for Column and Row Co-Controlled Embedded SRAM," 2005, 6 pages, Proceedings of the 2005 IEEE International Workshop on Memory Technology, Design, and Testing (MTDT).

* cited by examiner

FINE GRANULARITY POWER GATING

BACKGROUND

The present invention relates generally to integrated circuit memory devices, and more specifically to providing improved fine granularity power gating of a memory device.

Power gating an integrated circuit memory device generally relates to reducing leakage power in the memory device during operation. A static random access memory (SRAM) is one example of an integrated circuit memory device in which power gating is used to reduce leakage power. A typical SRAM device includes an array of individual SRAM cells each capable of storing a binary voltage value that represents a logical data bit (e.g., "0" or "1"). Power gating an SRAM device generally entails temporarily turning off blocks of cells in the array that are not in use to reduce the overall leakage power of the integrated circuit. During this temporary shutdown of blocks of SRAM cells in the memory array, these blocks operate at a low power mode or a power-gated mode by receiving a reduced voltage supply that is sufficient to retain data. When the blocks of SRAM cells are required for operation they are activated to operate at a full power mode or an active mode by receiving a full voltage supply. These two modes (i.e., active mode and power-gated mode) are switched at an appropriate time and in a suitable manner to minimize power while minimizing impact to performance. Power gating blocks of cells in an SRAM device in this manner facilitates the goal of minimizing leakage power by temporarily cutting power off to selective blocks that are not required in the active mode.

SUMMARY

In one embodiment, there is a device that comprises a memory array comprising a plurality of cells arranged in rows and columns. The rows of the memory array are segmented into a predetermined number of word line groups. Each row in a word line group has a word line disposed between parallel power supply lines. Each of the power supply lines in a row of a word line group is shared by an adjacent row in the word line group. A row on a boundary of a word line group has a power supply line shared by a row on a boundary of an adjacent word line group. All power supply lines in a word line group are at a full power voltage value in response to one of the rows in the word line group being selected by a word line. All power supply lines in a word line group adjacent to the word line group with the selected row are at a full power voltage value, and all power supply lines in other word line groups in the memory array are at a power-gated voltage value except for one row in the adjacent word line on a boundary with another word line group that is at a half-powered voltage value.

In a second embodiment, there is a device that comprises a memory array comprising a plurality of cells arranged in rows and columns. The rows of the memory array are segmented into a predetermined number of word line groups. Each row in a word line group has a word line disposed between power supply lines. Each of the power supply lines in a row of a word line group is shared by an adjacent row in the word line group. A row on a boundary of a word line group has a power supply line shared by a row on a boundary of an adjacent word line group. The device also comprises word line decoder circuitry associated with each of the predetermined word line groups that is configured to activate one of the word lines in a word line group in response to a decoding address selecting a row in that word line group. The device further comprises a power supply line driver device associated with each of the predetermined word line groups that is configured to control a local power supply provided to all of the power supply lines in a word line group and all of the word line decoder circuitry associated with that word line group.

In a third embodiment, there is a circuit that comprises a memory array comprising a plurality of cells arranged in rows and columns. The rows of the memory array are segmented into a predetermined number of word line groups. Each row in a word line group has a word line disposed between power supply lines. Each of the power supply lines in a row of a word line group is shared by an adjacent row in the word line group. A row on a boundary of a word line group has a power supply line shared by a row on a boundary of an adjacent word line group. The circuit also comprises a plurality of word line drivers distributed across each of the predetermined word line groups. Each of the plurality of word line drivers in a word line group is configured to drive a word line in a row of the word line group. The circuit also comprises a plurality of word line decoders distributed across each of the predetermined word line groups. Each of the plurality of word line decoders in a word line group is configured to activate one of the plurality of word line drivers in the word line group. The circuit also comprises a power supply line driver device distributed across each of the predetermined word line groups. Each power supply line driver in a word line group is configured to control a local power supply provided to all of the power supply lines in the word line group and all of the word line drivers in the word line group. The circuit also comprises a word line group pre-decoder associated with each of the predetermined word line groups. Each word line group pre-decoder in a word line group is configured to generate a pre-decoding address that activates all power supply lines in the word line group to a full power voltage value and all power supply lines in an adjacent word line group to a full power voltage value except for one row in the adjacent word line group on a boundary with another word line group that is at a half-powered voltage value, while all other power supply lines in other word line groups in the memory array are at a power-gated voltage value.

DETAILED DESCRIPTION

As mentioned above, power gating an integrated circuit memory device such as, for example, a static random access memory (SRAM), generally entails temporarily turning off blocks of cells in the array that are not in use to reduce the overall leakage power of the integrated circuit. Typical power gating of an SRAM occurs at the bank level of the memory. For example, for a 512 Kbit (Kb) SRAM device built from an array of small banks each having 128 rows×512 bits/row that store a total of 64 Kb, power gating is partitioned throughout eight banks so that one bank receives a full power value, while the other banks receive a low-power voltage value or a power-gated voltage value. In such a power gating operation, a decode address will activate any one of these eight banks for reading or writing data via a bank address. Prior to activating a selected bank's word line, the power supply to that bank is charged up so that it is at its full potential (e.g., 1.0 volt), which places the selected bank in an active mode. The power supply lines to the remaining other seven unselected banks remain at a power-gated voltage (e.g., 0.7 volts), which places these banks in a power-gated mode that is sufficient to retain data. When another decode address arrives that activates one of the other banks, then the voltage to the power supply of the previously selected bank reduces to for example, 0.7 volts, placing that bank in the power-gated mode, while the power supply to the newly selected bank is increased to, for example 1.0 volts, placing that bank in the active mode. Power gating an SRAM device in this manner can provide up to 25% in leakage power savings.

A fine granularity approach to power gating can provide up to 55% leakage power savings. This fine granularity approach to power gating provides up to 55% leakage power savings by disposing power supply lines associated with each of the bitcells (cells) in the banks in a horizontal dimension of the memory array of the banks, such that these power supply lines are parallel to the word lines used to select the cells. In addition, ground lines associated with each of the cells are disposed in a vertical dimension of the memory array parallel to the true bit lines and the complement bit lines that are each connected to a column of the array. By disposing power supply lines, known in the art as $V_{CS}$ lines, in a horizontal dimension of the memory array banks, parallel to the word lines, each of these power supply lines become shared by adjacent cells in the memory. As a result, power supply lines that activate a row selected by one of the word lines are at a full-power voltage value and power supply lines that activate rows adjacent to the selected row are at a half-power voltage value, while cells in other rows and columns in the memory array are at a power-gated voltage value.

Figure 1:
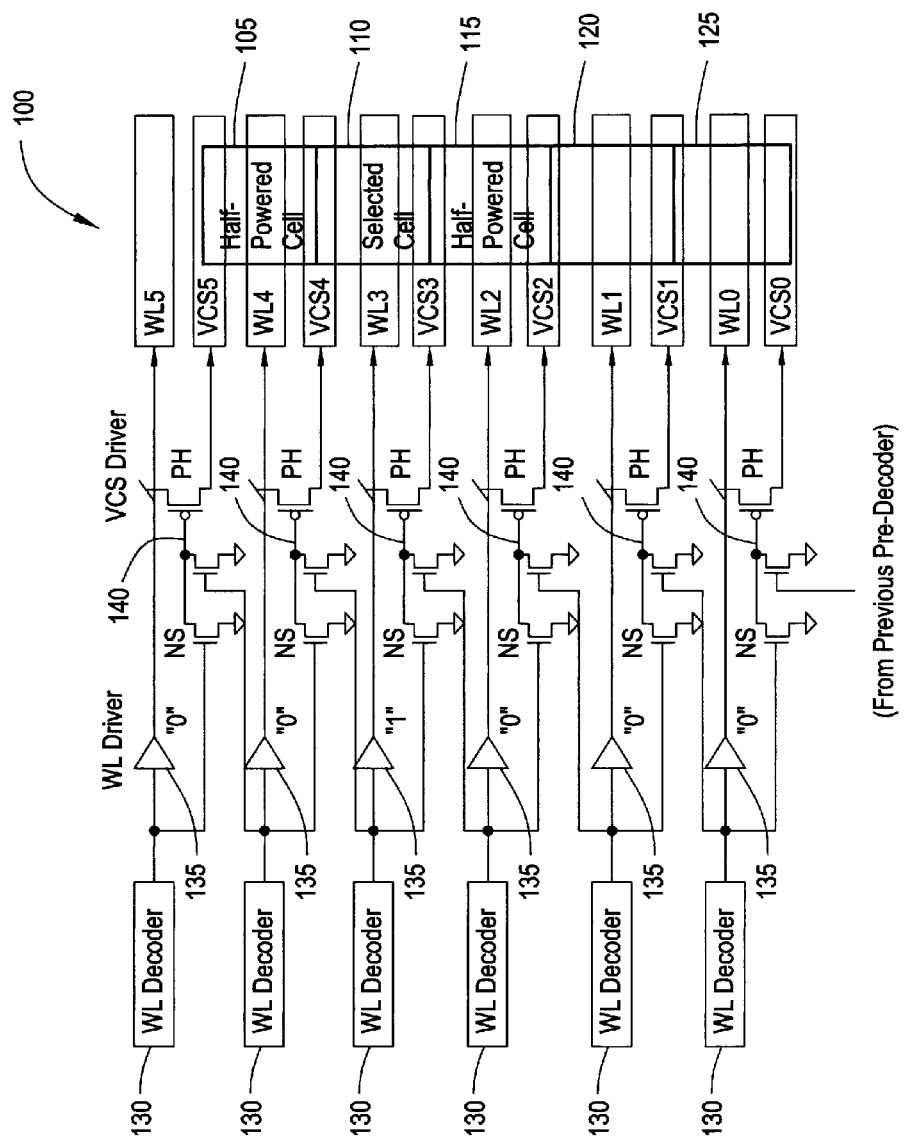
FIG. 1 shows a schematic illustrating a fine granularity power gating decoding scheme for a single row in a memory array.

FIG. 1 shows a schematic illustrating a fine granularity power gating decoding scheme for a single row in a memory array 100. For clarity, memory array 100 represents only part of a bank in the array. Those skilled in the art will appreciate that the bank would have more cells than what is illustrated in FIG. 1 as well as more banks than what is represented in this figure. As shown in FIG. 1, memory array 100 includes five cells 105, 110, 115, 120 and 125 located in different rows of the bank. Each cell is selected for activation by a respective word line. In particular, word line WL0 selects cell 125 for activation, word line WL1 selects cell 120 for activation, word line WL2 selects cell 115 for activation, word line WL3 selects cell 110 for activation, word line WL4 selects cell 105 for activation. Each cell includes VCS power supply lines for providing power to its respective rows. In particular, VCS0 and VCS1 power supply lines provide power to cell 125, VCS1 and VCS2 power supply lines provide power to cell 120, VCS2 and VCS3 power supply lines provide power to cell 115, VCS3 and VCS4 power supply lines provide power to cell 110, and VCS4 and VCS5 power supply lines provide power to cell 105.

As illustrated in FIG. 1, cell 110 has been selected by word line WL3 for activation. Consequently, VCS3 and VCS4 power supply lines provide a full-power voltage value to cell 110. Because cells 105 and 115 are adjacent to cell 110, these cells will receive a half-powered voltage condition due to each having one power supply line active (i.e., VCS3 and VCS4 power supply lines) and one power supply line not active (i.e., VCS2 and VCS5 power supply lines). In this example, the power supply lines for cells 120 and 125 would provide these cells with a power-gated voltage because their respective word lines WL0 and WL1 have not been selected.

In FIG. 1, a word line decoder (WL Decoder) 130 is connected to each of the word lines (i.e., WL0, WL1, WL2, WL3, WL4, and WL5) through a word line driver (WL Driver) 135. The word line decoders 130 represent logic that is used to select a particular word line for activation of a row in memory array 100. As shown in FIG. 1, only one word line decoder 130 and word line driver 135 are in a select state (represented by a "1") that activates a cell (i.e., cell 110). The other word line decoders 130 and word line drivers 135 are in an inactive state (represented by a "0"), and thus do not select any of the other cells (i.e., cells 105, 115, 120 and 125).

In addition to selecting word lines, word line decoders 130 include logic that activate the various power supply lines (i.e., VCS0, VCS1, VCS2, VCS3, VCS4, and VCS5) via power supply line drivers (VCS Driver) 140. As shown in FIG. 1, each power supply line driver 140 comprises a header device formed from field effect transistors (FETs). In one embodiment, each header device may include a P-type field effect transistor (PFET) header (PH) coupled to one of the VCS power supply lines and a pair of N-type field effect transistor (NFET) select headers (NS) coupled to a gate of PH. In this configuration, a first NFET in the select header NS couples to a word line decoder 130 that activates a row powered by the power supply line and a second NFET in the select header NS is coupled to an adjacent word line decoder. For example, consider the power supply line driver 140 that powers the power supply lines associated with word line WL3 (i.e., VCS3 and VCS4 power supply lines). In order to select word line WL3 for activation, the gate of header PH will be at ground to activate this transistor. The gate of header PH can be placed at ground by either the word line decoder 130 that selects word line WL3 or an adjacent word line decoder (e.g., the decoder that selects word line WL2 for activation). In both instances, the word line decoders turn on one of the NFETs in select header NS which grounds the gate of header PH to activate the PFET. In this manner, power supply line VCS3 can be activated, while power supply line VCS4 would be activated by word line decoder 130 associated with WL3 activating one of the NFETs in select device NS in the above row (i.e., WL4) which turns on the header PH in this row. Because power supply lines VCS3 and VCS4 will be on in this example, the cell selected by word line WL3 will be at a full-power voltage. The cells selected by word line WL2 and word line WL4 (i.e., 115 and 105) will be at a half-powered voltage condition due to each having one power supply line active (i.e., VCS3 and VCS4 power supply lines) and one power supply line not active (i.e., VCS2 and VCS5 power supply lines). The cells selected by word lines WL0 and WL1 would be at a power-gated voltage because their power supply lines have not been activated.

Figure 2:
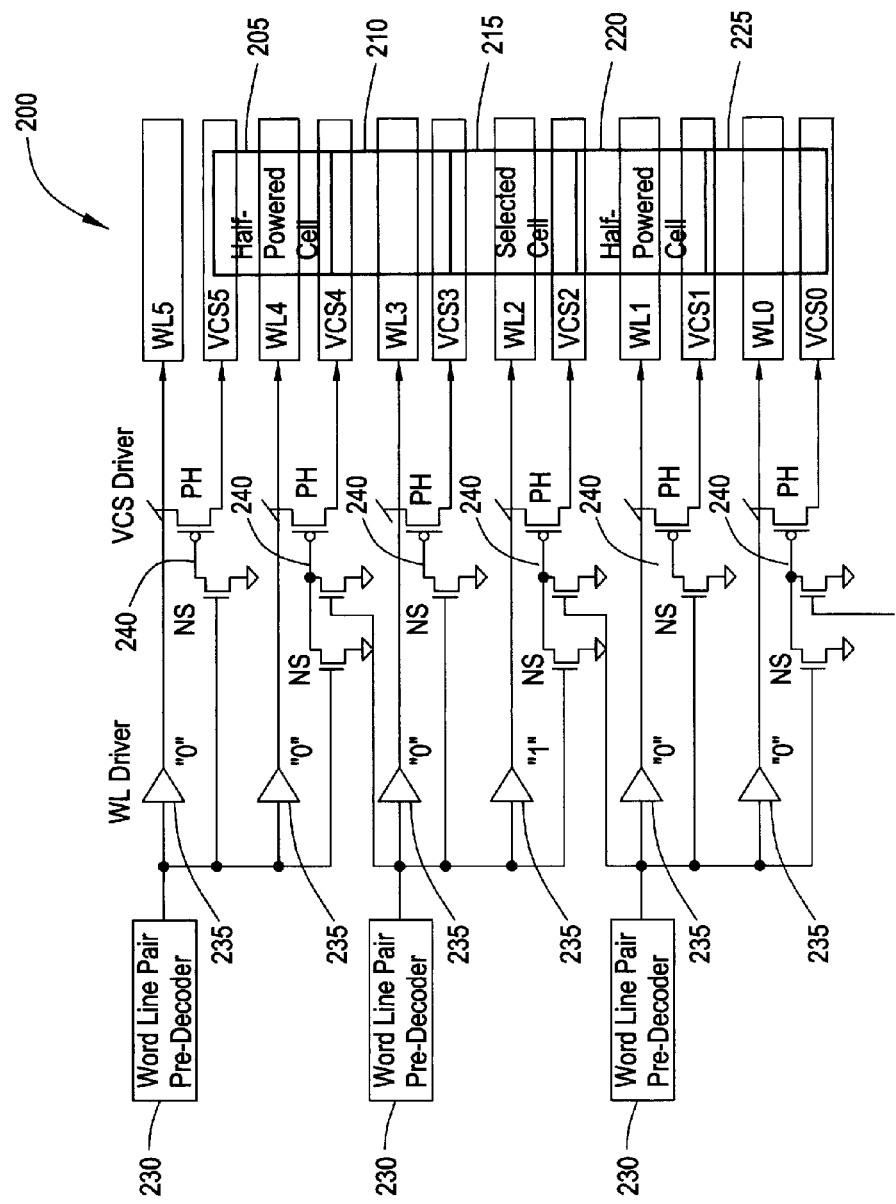
FIG. 2 shows a schematic illustrating a fine granularity power gating decoding scheme for a pair of rows in a memory array.

FIG. 2 shows a schematic illustrating a fine granularity power gating decoding scheme for a pair of rows in a memory array 200. For clarity, memory array 200 represents only part of a bank in the array. Those skilled in the art will appreciate that the bank would have more cells than what is illustrated in FIG. 2 as well as more banks than what is represented in this figure. As shown in FIG. 2, memory array 200 includes five cells 205, 210, 215, 220 and 225 located in different rows of the bank. Each cell is selected for activation by a respective word line. In particular, word line WL0 selects cell 225 for activation, word line WL1 selects cell 220 for activation, word line WL2 selects cell 215 for activation, word line WL3 selects cell 210 for activation, and word line WL4 selects cell 205 for activation. Each cell includes VCS power supply lines for providing power to its respective rows. In particular, VCS0 and VCS1 power supply lines provide power to cell 225, VCS1 and VCS2 power supply lines provide power to cell 220, VCS2 and VCS3 power supply lines provide power to cell 215, VCS3 and VCS4 power supply lines provide power to cell 210, and VCS4 and VCS5 power supply lines provide power to cell 205.

In FIG. 2, a word line pair pre-decoder 230 is connected to a pair of word lines for selection of a pair of cells in the rows of memory array 200. For each pair of word lines that can be selected, word line pair pre-decoder 230 is also connected to the power supply lines associated with the pair of word lines. In FIG. 2, the bottom word line pair pre-decoder 230 connects to word line WL0 of cell 225 and word line WL1 of cell 220, the middle word line pair pre-decoder 230 connects to word line WL3 of cell 210 and word line WL2 of cell 215, and the top word line pair pre-decoder 230 connects to word line WL4 of cell 205 and word line WL5 of another cell adjacent to cell 205 that is not illustrated in this figure.

Word line pair pre-decoder 230 further includes logic for connecting to the VCS power supply lines associated with each pair of word lines that it selects. In FIG. 2, bottom word line pair pre-decoder 230 connects with VCS0, VCS1 and VCS2 power supply lines, middle word line pair pre-decoder 230 connects with VCS2, VCS3 and VCS4 power supply lines, and top word line pair pre-decoder 230 connects with VCS4, VCS5 power supply lines and another VCS power supply line associated above and adjacent to cell 205 that is selected upon selection of word line WL5. In this configuration, each word line pair pre-decoder 230 is configured to select power supply lines that provide power to the pair of word lines that are selected by that pre-decoder. In addition, each word line pre-decoder 230 is configured to select a power supply line associated with a word line that is adjacent to one of the pair of word lines that are selected by a neighboring pre-decoder. In particular, bottom word line pair pre-decoder 230 connects with VCS2 power supply line which powers cell 215 and cell 220 which is selected by middle word line pair pre-decoder 230. Middle word line pair pre-decoder 230 connects with VCS4 power supply line which powers cell 210 and cell 205 which is selected by top word line pair pre-decoder 230.

Each word line pair pre-decoder 230 is connected to a pair of word lines for selection and activation through a pair of word line drivers (WL Driver) 235. As shown in FIG. 2, only one word line pair pre-decoder 230 (i.e., the middle word line pair pre-decoder) and word line driver 235 are in a select state (represented by a "1") that activates a cell (i.e., cell 215). The other word line pair pre-decoders 230 and word line drivers 235 are in an inactive state (represented by a "0"), and thus do not select any of the other cells (i.e., cells 205, 210, 220 and 225).

In addition to including logic for selecting word lines, word line pair pre-decoders 230 include logic that activates the various power supply lines (i.e., VCS0, VCS1, VCS2, VCS3, VCS4, and VCS5) via power supply line drivers (VCS Driver) 240. Each power supply line driver 240 enables the word line pair pre-decoders 230 to select their respective VCS power supply lines in the manner described above. In particular, bottom word line pair pre-decoder 230 connects with VCS0, VCS1 and VCS2 power supply lines through a power supply line driver 240, middle word line pair pre-decoder 230 connects with VCS2, VCS3 and VCS4 power supply lines through a power supply line driver 240, and top word line pair pre-decoder 230 connects with VCS4, VCS5 power supply lines through a power supply line driver 240 and another VCS power supply line associated above and adjacent to cell 205 that is selected upon selection of word line WL5.

In the embodiment illustrated in FIG. 2, cell 215 has been selected by word line WL2 for activation by middle word line pair pre-decoder 230 through a power supply line driver 240. Consequently, VCS2 and VCS3 power supply lines are selected to provide a full-power voltage value to cell 215. Because each word line pair pre-decoder is configured to select a pair of word lines, middle word line pair pre-decoder 230 will select the power supply lines associated with cell 210 (i.e., VCS3 and VCS4 power supply lines) even though word line WL3 was not selected. Since cells 205 and 220 are adjacent to cells 210 and 215, these cells will receive a half-powered voltage due to each having one power supply line active (i.e., VCS2 and VCS4 power supply lines) and one power supply line not active (i.e., VCS1 and VCS5 power supply lines). The power supply lines for cell 225 and the cell above and adjacent to cell 205 would provide these cells with a power-gated voltage because their respective word lines WL0 and WL5 have not been selected.

Using each word line pair pre-decoder 230 to connect to a pair of word lines and their respective VCS power supply lines enables this configuration to be more area efficient than the embodiment illustrated in FIG. 1. In particular, there are fewer components associated with the power supply line drivers 240 shown in FIG. 2 as opposed to the power supply line drivers 140 shown in FIG. 1. As shown in FIG. 2, each power supply line driver 240 comprises a header device formed from FETs. In one example, each header device may include a PFET header (PH) coupled to one of the VCS power supply lines and at least one NFET select device (NS) coupled to a gate of PH. As shown in FIG. 2, the power supply line driver 240 associated with even numbered VCS power supply lines (i.e., VCS0, VCS2, VCS4) includes more select device NS transistors than the power supply line drivers 240 associated with odd numbered VCS power supply lines (i.e., VCS1, VCS3, VCS5).

As shown in FIG. 2, power supply line drivers 240 associated with even numbered VCS power supply lines (i.e., VCS0, VCS2, VCS4) include two NFETs. A first NFET in select device NS couples to a word line pair pre-decoder 230 that is used to activate a row powered by that even-numbered power supply line and a second NFET in select device NS is coupled to an adjacent word line pair pre-decoder. For example, consider the power supply line driver 240 that powers the VCS2 power supply line associated with word line WL2. One of the NFETs in that power supply line driver 240 is used in conjunction with the header PH in that driver to select the VCS2 power supply line for activation in response to receiving instructions from the middle word line pair pre-decoder 230. The other NFET of the select device in that power supply line driver 240 is used in conjunction with the header PH in that driver to select the VCS2 power supply line for activation in response to receiving instructions from the bottom word line pair pre-decoder 230.

Power supply line drivers 240 associated with odd numbered VCS power supply lines (i.e., VCS1, VCS3, and VCS5) include one NFET select device. This NFET couples to the word line pair pre-decoder 230 that is used to activate a row powered by that odd-numbered power supply line. For example, consider the power supply line driver 240 that powers the VCS3 power supply line associated with word lines WL2 and WL3. This NFET in that power supply line driver 240 is used in conjunction with the header PH in that driver to select the VCS3 power supply line for activation in response to receiving instructions from the middle word line pair pre-decoder 230 and no other decoders. Thus, with this configuration, odd and even numbered VCS power supply lines are selectable by a respective word line pair pre-decoder 230 associated with that pair of word lines, and the even numbered VCS power supply lines are further selectable by an adjacent word line pre-decoder.

For an example illustrating the operation of the schematic shown in FIG. 2, consider the power supply line drivers 240 that powers the power supply lines (VCS2 and VCS3 power supply lines) associated with word line WL2. In order to select word line WL2 for activation, the gates of the header PH transistors for these power supply line drivers will be at ground to activate these transistors. The gate of the header PH transistor for the even-numbered VCS power supply line (VCS2 power supply line) can be placed at ground by either the word line pair pre-decoder 230 that selects word line WL2 or an adjacent word line pair pre-decoder (i.e., the bottom word line pair pre-decoder that selects word line WL1 for activation). On the other hand, the gate of the header PH transistor for the odd-numbered VCS power supply line (VCS3 power supply line) can be placed at ground by the word line pair pre-decoder 230 that selects word line WL2 (i.e., the middle word line pair pre-decoder) for activation.

The other word line (i.e., word line WL3) that is selected by the middle word line pair pre-decoder 230 and its respective VCS power supply lines (VCS3 and VCS4) would be activated in a similar manner but with top word line pair pre-decoder 230. In particular, in order to select word line WL3 for activation, the gates of the PH transistors for these power supply line drivers will be at ground to activate these transistors. The gate of the PH transistor for the even-numbered VCS power supply line (VCS4 power supply line) can be placed at ground by either the middle word line pair pre-decoder 230 that selects word line WL3 or an adjacent word line pair pre-decoder (i.e., the top word line pair pre-decoder that selects word line WL4 for activation). On the other hand, the gate of the PH transistor for the odd-numbered VCS power supply line (VCS3 power supply line) can be placed at ground by the word line pair pre-decoder 230 that selects word line WL2 (i.e., the middle word line pair pre-decoder) for activation.

Additional details associated with the fine granularity power gating schemes described in FIGS. 1 and 2 are set forth in U.S. patent application Ser. No. 13/315,604 entitled "FINE GRANULARITY POWER GATING" filed Dec. 9, 2011.

Figure 3:
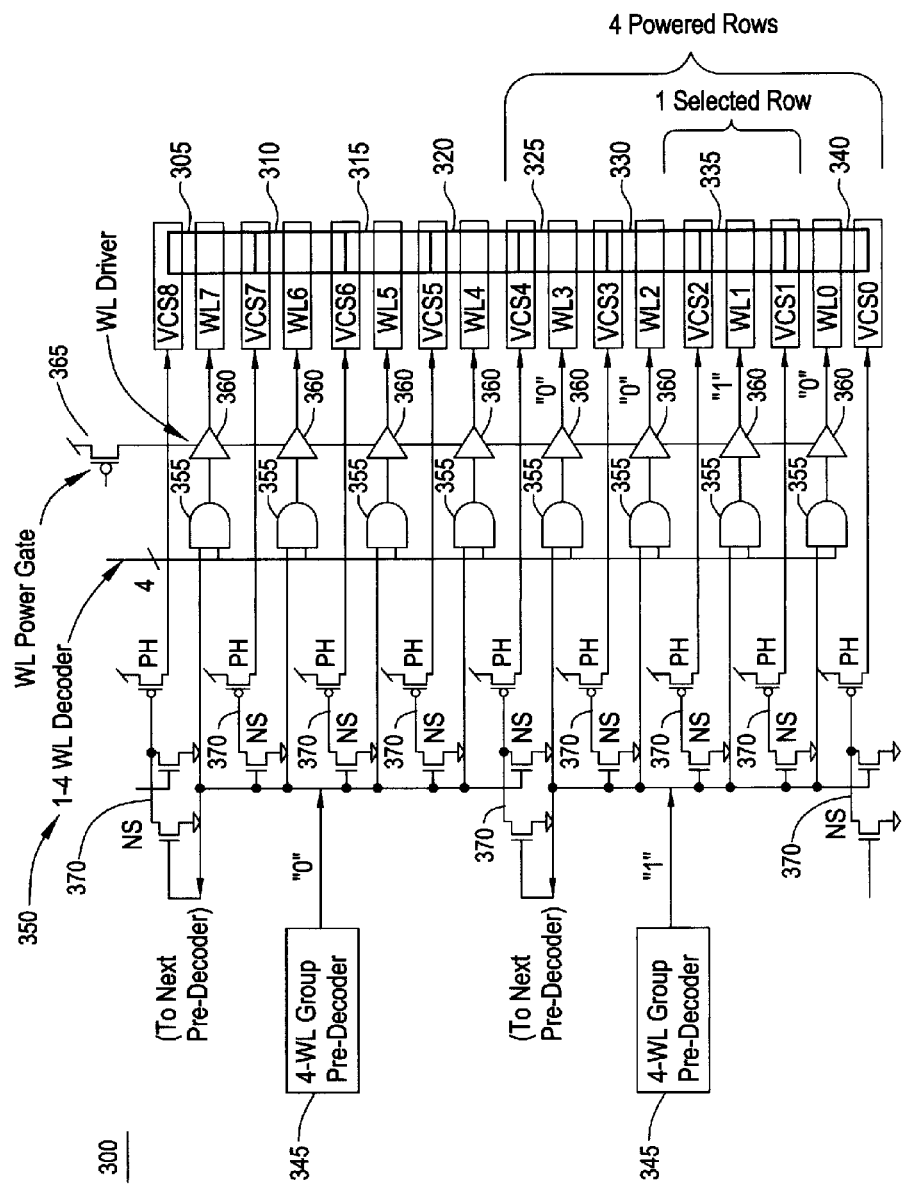
FIG. 3 shows a schematic illustrating a fine granularity power gating decoding scheme for four rows in a memory array.

The word line pair pre-decoder configuration described in FIG. 2 is not limited to being used to select and activate only one pair of word lines. Instead, the word line pair pre-decoders can be configured to select and activate more than one pair of word lines. For example, the word line pair pre-decoders can be used to select pairs that activate four rows, eight rows, etc. FIG. 3 shows a schematic illustrating a fine granularity power gating decoding scheme for four rows in a memory array 300. For clarity, memory array 300 represents only part of a bank in the array. Those skilled in the art will appreciate that the bank would have more cells than what is illustrated in FIG. 3 as well as more banks than what is represented in this figure. As shown in FIG. 3, memory array 300 includes eight cells 305, 310, 315, 320, 325, 330, 335 and 340 located in different rows of the bank. Each cell is selected for activation by a respective word line. In particular, word line WL0 selects cell 340 for activation, word line WL1 selects cell 335 for activation, word line WL2 selects cell 330 for activation, word line WL3 selects cell 325 for activation, word line WL4 selects cell 320 for activation, word line WL5 selects cell 315 for activation, word line WL6 selects cell 310 for activation, and word line WL7 selects cell 305 for activation. Each cell includes VCS power supply lines for providing power to its respective rows. In particular, VCS0 and VCS1 power supply lines provide power to cell 340, VCS1 and VCS2 power supply lines provide power to cell 335, VCS2 and VCS3 power supply lines provide power to cell 330, VCS3 and VCS4 power supply lines provide power to cell 325, VCS4 and VCS5 power supply lines provide power to cell 320, VCS5 and VCS6 power supply lines provide power to cell 315, VCS6 and VCS7 power supply lines provide power to cell 310, and VCS7 and VCS8 power supply lines provide power to cell 305.

In FIG. 3, a four word line (4-WL) group pre-decoder 345 is connected to a group of four word lines for selection of one of the word lines in the group. In particular, the 4-WL group pre-decoder 345 connects to each word line in the four word line group via a word line decoder 350 formed from a series of AND gates 355 and a word line (WL) driver 360. As shown in FIG. 3, the bottom 4-WL group pre-decoder 345 can select a word line from the group comprising WL0, WL1, WL2 and WL3, while the top 4-WL group pre-decoder 345 can select a word line from the group comprising WL4, WL5, WL6 and WL7. In operation, the word line decoder 350 can be a 1-4 word line decoder (1-4 WL decoder) that functions to activate only one of the four AND gates in the four word line group. That is, once one of the four word line groups has been decoded with a decoding address by a 4-WL group pre-decoder 345, then the word line decoder 350 will select one of the four AND gates 355 in the group. The selected AND gate will then drive the pertinent word line driver 360 to select the word line that has been decoded by the 4-WL group pre-decoder 345. Note that a word line (WL) power gate 365 shown in FIG. 3 as a PFET can provide a power supply to all of the word line drivers 360 in this bank of the memory array 300.

Power supply line drivers 370 are used to provide power to each of the power supply lines (i.e., VCS0, VCS1, VCS2, VCS3, VCS4, VCS5, VCS6, VCS7, and VCS8) associated with the word lines in each group. Each power supply line driver 370 includes a PFET header (PH) coupled to one of the VCS power supply lines and at least one NFET select device (NS) coupled to a gate of header PH. As shown in FIG. 3, the power supply driver 370 on the boundary of each of the four word line group includes two NFET select devices NS. For example, the row associated with cell 325 (selected by WL3) is on an edge of the bottom four word line group that forms a boundary with the row associated with cell 320, which is at an edge with the top four word line group. As a result, power supply line VCS4 is shared by both word line groups. The power supply line driver 370 at this position uses two NFET select devices NS in order to be decoded by either the bottom 4-WL group pre-decoder 345 or the top WL group pre-decoder 345. In this manner, power supply line VCS4 can be decoded by bottom 4-WL group pre-decoder 345 if cell 325 is to be selected, while power supply lines VCS4 can also be decoded by top 4-WL group pre-decoder 345 if cell 320 is to be selected. FIG. 3 also shows the use of two NFET select devices NS on the top and bottom portion of the array 300, which are other areas representing boundaries between groups of four word lines.

In the configuration of FIG. 3, during selection of one row, four of the rows in this bank of memory array will be fully powered in an active mode, one row on the boundary of the adjacent 4 word line group will be at a half-powered voltage, while the other remaining rows in the adjacent group will be at a power-gated mode with a reduced voltage supply. In the example illustrated in FIG. 3, the bottom 4-WL Group Pre-Decoder 345 is activated and generates an output of a logic "1". This causes each select device NS in the bottom group of four word lines to turn on. Turning on the NS select devices causes the gates of each of header PH to go to ground. The grounding of the gates causes each of the transistors in the header PH to turn on and charge up all of the power supply lines associated with this four word line group (i.e., VCS0, VCS1, VCS2, and VCS3) to a full power voltage. The logic "1" generated from the bottom 4-WL Group Pre-Decoder 345 also turns on the first transistor of select device NS associated with the cell 320 in the adjacent four word line group. Turning on the transistor of this select device grounds the gate of the header PH in this row, causing it to charge up the power supply line VCS4 to a full voltage. The logic "1" generated from the bottom 4-WL Group Pre-Decoder 345 also enables word line WL1 to be selected from the bottom group of four word lines. In particular, the word line decoder 350 would decode (i.e., generate a logic "1") the AND gate 355 associated with word line WL1. This decoding from the word line decoder 350 and the decoding from the bottom 4-WL Group Pre-Decoder 345 activates the AND gate 355 associated with word line WL1 and drives its word line driver 360 to select word line 1.

Since the top 4-WL Group Pre-Decoder 345 generates a logic "0" output, all of the power supply lines associated with this four word line group (i.e., VCS5, VCS6, VCS7 and VCS8) will be in a power-gated voltage. That is, none of the power supply line drivers 370 in this top group of four word lines will be activated due to the logic "0" output, thereby power gating cells 315, 310 and 320. Furthermore, none of the word line decoders 355 and word line drivers 360 in this top group of four word lines will be activated, keeping the rows associated with cells 315, 310 and 320 unselected.

In this manner, only one row in this group of word lines in the bank of the memory array 300 (i.e., cell 335) is selected. All of the other rows in the bottom group of four word lines are unselected, as are all of the rows in the top group of four word lines. Furthermore, four of the rows in this bank of memory array 300 will be fully powered in an active mode since power supply lines VCS0, VCS1, VCS2, VCS3 and VCS4 are at a full powered voltage. The row associated with WL4 will be at a half-power voltage value since power supply line VCS4 is powered at a full voltage and power supply line VCS5 is at a power-gated voltage. The other two rows (cells 310 and 305) in this bank of memory array 300 will be at a power-gated mode since power supply lines VCS5, VCS6, VCS7 and VCS8 are at a power-gated voltage.

One of the drawbacks associated with the fine granularity power gating decoding scheme for four rows in a memory array as illustrated in FIG. 3 is that its power savings is subject to data dependency variability. As noted above, each power supply line (i.e., VCS0, VCS1, VCS2, VCS3, VCS4, VCS5, VCS6, VCS7, and VCS8) is separated from each other and activated by its own header PH. It has been determined that having different data types on a cell can affect the level at which voltage drops on the header PH during instances in which its power supply line is at the retention level during a power-gated mode. For example, consider a half-powered cell in which one of its power supply lines is at a full powered voltage while the other power supply line is at a retention level. The voltage value of the power supply line at the retention level changes depending on the data that is on either of the two cells that are adjacent the power supply line at the retention level. The possible data scenarios would include a logic "0" on both cells, a logic "1" on both cells, a logic "0" on one cell and a logic "1" on the other cell, and a logic "1" on one cell and a logic "0" on the other cell. In any event, there can be a substantial amount of variation in the voltage drop on the header PH that controls the power to the power supply line shared by these cells. For example, the voltage drop can be as much as 160 millivolts (mV) and drop as little as 80 mV. This is a substantial amount of variation in the voltage drop, which will affect power reduction and power-gate margins for these half-powered cells.

Another source of variation that affects the power savings of the fine granularity power gating decoding scheme illustrated in FIG. 3 is the variation associated with header PH itself. It has been determined that there is a wide voltage drop distribution in each of the transistors of the headers that are utilized in the fine granularity power gating decoding scheme illustrated in FIG. 3. The wide voltage drop distribution of each header PH is due to each transistor's intrinsic variation resulting from a random voltage threshold that can impact the transistor.

Embodiments of the present invention obviate the drawbacks associated with the fine granularity power gating decoding scheme illustrated in FIG. 3 by grouping the PH headers in each of the groups of four word lines together. In this manner, the embodiments of the present invention obtain reduced variation and data dependency as compared to the embodiment illustrated in FIG. 3. This results in a more consistent and larger voltage drop, and improved power savings during power gating without impacting the margins of half-powered cells. In particular, the voltage drop variation associated with grouping the PH headers together can be half of the variation that is present with PH headers that are not combined as depicted in FIG. 3.

Grouping the PH headers in each of the groups of word lines together enables the various embodiments of the present invention to obtain further power savings by using this larger group of PH headers to power up the word line drivers in each of the word line groups. Besides the cells in a memory array, the word line drivers are the next largest contributor to the overall leakage power of a memory device. The larger size of the header device that results from grouping the PH headers together makes it suitable for powering the word line drivers without adversely impacting the performance of each of the drivers. Using a single header PH to power a word line driver in the embodiment depicted in FIG. 3 is not readily feasible without compromising performance of the word line driver. In particular, the use of a single header PH to power up a word line driver would result in a delayed activation of a word line due to its size. On the other hand, the larger header PH that results from combining the PH headers together results in an added strength that enables sharing with the word line drivers. Furthermore, this enables a lower threshold voltage for the word line drivers, which corresponds to higher word line performance. As a result, these features facilitate local fine granularity power gating of the word line drivers, which translates into further power savings for the memory array.

Figure 4:
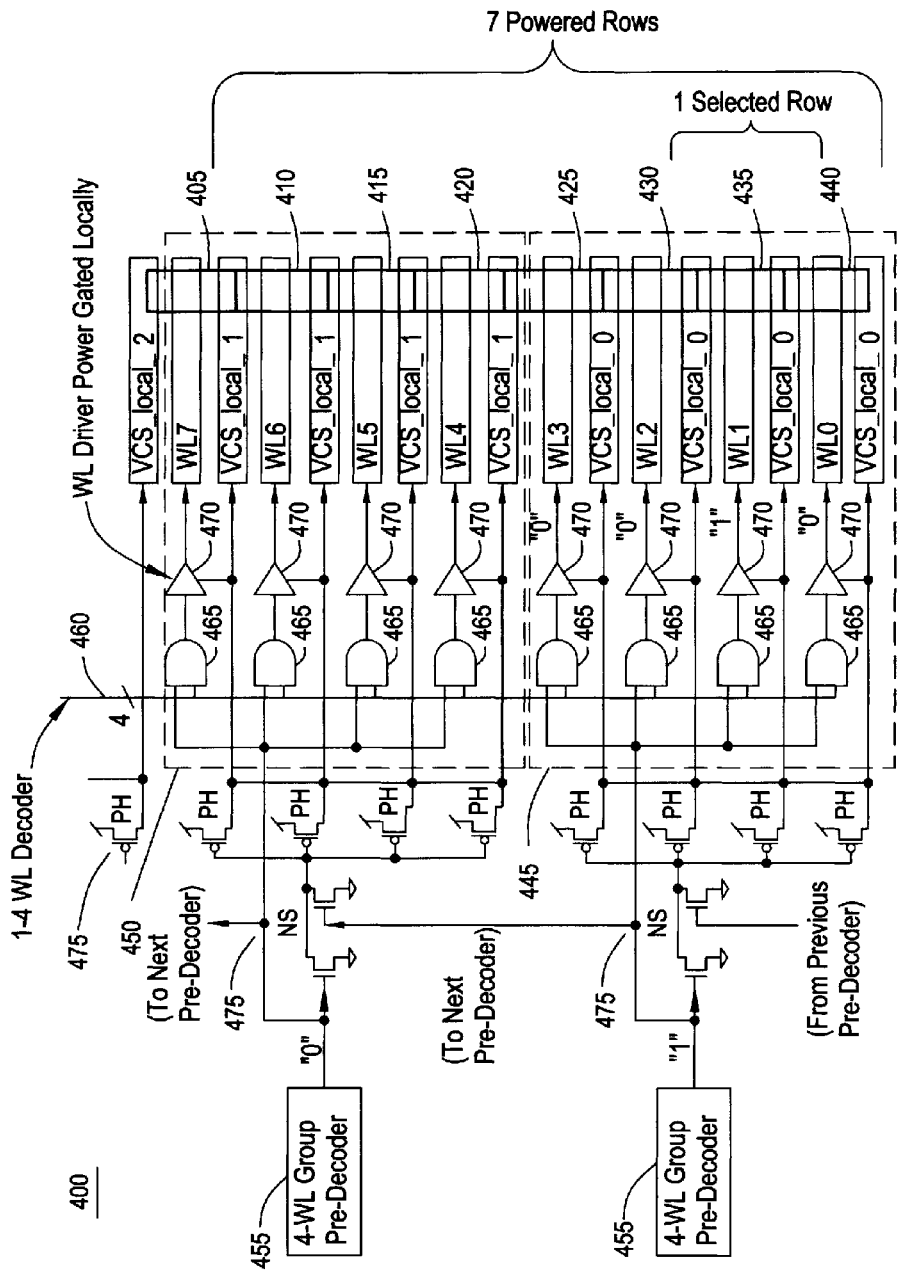
FIG. 4 shows a schematic illustrating a fine granularity power gating decoding scheme for four rows in a memory array according to one embodiment of the present invention.

FIG. 4 shows a schematic illustrating a fine power gating decoding scheme for four rows in a memory array 400 according to one embodiment of the present invention. For clarity, memory array 400 represents only part of a bank in the array. Those skilled in the art will appreciate that the bank would have more cells than what is illustrated in FIG. 4 as well as more banks than what is represented in this figure. As shown in FIG. 4, memory array 400 includes eight cells 405, 410, 415, 420, 425, 430, 435 and 440 located in different rows of the bank. Each cell is selected for activation by a respective word line. In particular, word line WL0 selects cell 440 for activation, word line WL1 selects cell 435 for activation, word line WL2 selects cell 430 for activation, word line WL3 selects cell 425 for activation, word line WL4 selects cell 420 for activation, word line WL5 selects cell 415 for activation, word line WL6 selects cell 410 for activation, and word line WL7 selects cell 405 for activation.

The rows of the memory array 400 are segmented into a predetermined number of word line groups. In FIG. 4, memory array 400 comprises four word line groups, group 445 and 450. Word line group 445 includes word line WL0, word line WL1, word line WL2 and word line WL3, while word line group 450 includes word line WL4, word line WL5, word line WL6 and word line WL7. In addition to the word lines, word line groups 445 and 450 include the power supply lines associated with each of the word lines. As shown in FIG. 4, a pair of parallel VCS_local$_0$ power supply lines provide power to three of the cells (i.e., cells 430, 435, and 440) in word line group 445, while a pair of parallel VCS_local$_{-1}$ power supply lines provide power to three of the cells (i.e., cells 410, 415, and 420) in word line group 450. The rows of each word line group that is on a boundary with an adjacent word line group have a local power supply line from each word line group. As shown in FIG. 4, cell 425 in word line group 445 has its word line WL4 disposed between the VCS_local$_0$ power supply and the VCS_local$_{-1}$ power supply line associated with word line group 450. Similarly, cell 405 in word line group 450 has its word line WL7 disposed between the VCS_local$_{-1}$ power supply and the VCS_local$_{-2}$ power supply line used in adjacent word line group not fully illustrated in FIG. 4.

Those skilled in the art will recognize that the segmentation of the word lines into groups of four word lines is illustrative of only one example and is not meant to be limit the embodiments described herein. For example, the embodiments of the present invention are suitable for use with decoding any multiple of word line pairs in a memory array. For example, the embodiments of the present invention could be used with word line groups that have been segmented by two word lines, four word lines, eight word lines, etc.

Referring back to FIG. 4, a four word line (4-WL) group pre-decoder 455 is connected to word line group 445 and 450 for selection of one of the word lines in these groups. In particular, each 4-WL group pre-decoder 455 connects to each word line in the word line groups 445 and 450 via a word line decoder 460 formed from a series of AND gates 465 and a word line (WL) driver 470. As shown in FIG. 4, the bottom 4-WL group pre-decoder 455 can select one of the word lines in the word line group 445, while the top 4-WL group pre-decoder 455 can select one of the word lines in the word line group 450.

The word line decoder 460 can be a 1-4 word line decoder (1-4 WL decoder) that functions to activate only one of the four AND gates in word line groups 445 and 450. That is, once one of the four word line groups has been decoded by a 4-WL group pre-decoder 455, then the word line decoder 460 will select one of the four AND gates 465 in the group. The selected AND gate will then drive the pertinent word line driver 470 to select the word line that has been decoded by the 4-WL group pre-decoder 455.

Power supply line drivers 475 are used to provide power to each of the local power supply lines (i.e., VCS_local$_0$, and VCS_local$_{-1}$) associated with the word lines in word line groups 445 and 450. Each power supply line driver 475 can include a PFET header (PH) coupled to one of the VCS local power supply lines and a pair of NFET select devices (NS) coupled to a gate of header PH. As shown in FIG. 4, each gate of the PFETs is tied together and each drain of the PFETs is tied together, forming a group of PFETs (a grouped PH header) that will serve as a voltage domain for all of the local power supply lines in a word line group. The tied drains of the PFETs in the grouped PH header are connected to the word line drivers 470 in each word line group. This allows the power supply line drivers 475 associated with word line group 445 and 450 to power gate the word line drivers 470 while these word line groups are in a power-gated mode. This allows memory array 400 to have leakage power savings in addition to savings which is obtained from this configuration and described below.

In order to handle cells in word line groups that are on the boundary with a cell in an adjacent word line group that share a local power supply line from each group, embodiments of the present invention utilize the two NFET select devices NS to be decoded by either the bottom 4-WL group pre-decoder 455 or the top 4-WL group pre-decoder 455. In this manner, the local power supply lines VCS_local$_0$ can be decoded by bottom 4-WL group pre-decoder 455 if a cell in word line group 445 is to be selected, while power supply lines VCS_local$_0$ can also be decoded by another 4-WL group pre-decoder not depicted in FIG. 4. Similarly, the local power supply lines VCS_local$_{-1}$ can be decoded by top 4-WL group pre-decoder 455 if a cell in word line group 450 is to be selected, while power supply lines VCS_local$_{-1}$ can also be decoded by bottom 4-WL group pre-decoder 455. Because the PFETs of the grouped header are tied together at their gates, once a pre-decode address is generated from a 4-WL Group Pre-Decoder 455, the local power supply lines will be activated to provide full power to all of the cells in the word line group. Not only do the local power supply lines for the selected word line group receive a full power voltage, but so does the local power supply lines for the adjacent word line group. This occurs because the power supply line drivers 475 for each word line group utilizes the pair of select devices NS, where one NFET connects to the 4-WL Group Pre-Decoder 455 in its word line group and the other NFET connects to the 4-WL Group Pre-Decoder 455 of an adjacent word line group. Thus, a pre-decode address that is generated from one 4-WL Group Pre-Decoder 455 will be also be sent to the power supply line driver 475 of the adjacent word line group. As a result, both groups of the combined PH headers in the word line groups will be activated, causing both of their respective local power supply lines to provide a full power voltage to each of the cells in the word line groups.

Those skilled in the art will recognize that the use of two NFETs for the select device NS is only an example of one configuration of select device that could be used to activate the PH headers. Embodiments of the present invention are not meant to be limited to any particular number of NFETs used for NS select devices. Similarly, the embodiments of the present invention are not meant to be limited to any number of PFETs used in the PH headers. For example, if desired one could reduce the number of NFETS to one in order to activate two PFETs in a PH header.

In the example illustrated in FIG. 4, during selection of one row, seven of the rows in this bank of memory array will be fully powered in an active mode, while one row on the boundary of an adjacent four word line group will be at a half-powered voltage (i.e., cell 405 because VCS_local$_{-1}$, is powered on while VCS_local$_{-2}$ is not). Note that the other remaining rows in the other word line groups will be at a power-gated mode with a reduced voltage supply.

With further reference to the example illustrated in FIG. 4, the bottom 4-WL Group Pre-Decoder 455 is activated and generates an output of a logic "1". This causes one of the NFETs in the NS select device in the bottom word line group to turn on. Turning on this NFET causes the gates of each of the PH header to go to ground. The grounding of the gates causes each of the PH headers in the group to turn on and charge up the local power supply lines (i.e., VCS_local$_0$)

associated with word line group 445 to a full power voltage. The logic "1" generated from the bottom 4-WL Group Pre-Decoder 455 also turns on one of the NFETs in the NS select device associated with the adjacent word line group 450. Turning on this NFET grounds the gates of the PH headers in this word line group, causing it to charge up the local power supply line $VCS\_local_{-1}$ to a full voltage. The logic "1" generated from the bottom 4-WL Group Pre-Decoder 455 also enables word line WL1 to be selected from word line group 445. In particular, the word line decoder 460 would decode (i.e., generate a logic "1") the AND gate 465 associated with word line WL1. This decoding from the word line decoder 460 and the decoding from the bottom 4-WL Group Pre-Decoder 455 activates the AND gate 465 associated with word line WL1 and drives its word line driver 470 to select word line WL1. Even though the top 4-WL Group Pre-Decoder 455 generates a logic "0" output, the local power supply line $VCS\_local_{-1}$ associated with word line group 450 will be at a full-powered voltage because one of the NFETs in power supply line driver 475 will receive the pre-decoding address (i.e., logic "1") generated from the bottom 4-WL Group Pre-Decoder 455.

In this manner, only one row in the word line groups 445 and 450 in the bank of the memory array 400 (i.e., cell 435) is selected. All of the other rows in word line groups 445 and 450 are unselected, as are all of the rows in the other word line groups that are not illustrated in FIG. 4. Furthermore, seven of the rows in the word line groups 445 and 450 from this bank of memory array 400 will be fully powered in an active mode since local power supply lines $VCS\_local_{-0}$ and $VCS\_local_{-1}$ are at a full powered voltage. The row associated with word line WL7 will be at a half-power voltage since local power supply $VCS\_local_{-1}$ is powered at a full voltage and local power supply $VCS\_local_{-2}$ is at a power-gated voltage. The other rows in the other word line groups in this bank of memory array 400 will be at a power-gated mode since their local power supply lines will be at power-gated voltage.

As noted above, the configuration of FIG. 4 provides reduced variation, fine granular power gating of the word line drivers, improved performance of the word line drivers in comparison to the embodiment illustrated in FIG. 3. In addition, because the number of NFETs in the NS select device has been reduced, there is a significant reduction in area associated with implementing this configuration. Another advantage of the embodiment associated with FIG. 4, is that this configuration opens metal level five (M5) resources to designers to enable a longer word line.

Those skilled in the art will appreciate that the aforementioned advantages associated with the embodiments described with respect to FIG. 4 result in more rows of memory array being powered on during a power gating mode. For example, the embodiment described with respect to FIG. 3 will have four full-powered rows, while embodiment described with respect to FIG. 4 will have seven full-powered rows. However, if the banks of each memory array had 128 word line drivers, having eight word line drivers selected and 120 word line drivers unselected is only a very small percentage of word line driver leakage power in comparison to having 128 word line drivers selected as in the configuration of FIG. 3. The very small loss in leakage power savings associated with the powering up of seven rows (FIG. 4) compared to powering up of four rows (FIG. 3) is marginalized by the advantages associated with the configuration described with respect to FIG. 4.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A device, comprising:
   a memory array comprising a plurality of cells arranged in rows and columns, wherein the rows of the memory array are segmented into a predetermined number of word line groups, each word line group including a plurality of rows of the memory array, each row in a word line group has a word line disposed between parallel power supply lines, each of the power supply lines in a row of a word line group is shared by an adjacent row in the word line group, wherein a row on a boundary of a word line group has a power supply line shared by a row on a boundary of an adjacent word line group, and wherein all power supply lines in a word line group are at a full power voltage value in response to one of the rows in the word line group being selected by a word line, all power supply lines in a word line group adjacent to the word line group with the selected row are at a full power voltage value, and all power supply lines in other word line groups in the memory array are at a power-gated voltage value except for one row in the adjacent word line on a boundary with another word line group that is at a half-powered voltage value.

2. A device, comprising:
   a memory array comprising a plurality of cells arranged in rows and columns, wherein the rows of the memory array are segmented into a predetermined number of word line groups, each word line group including a plurality of rows of the memory array, each row in a word line group has a word line disposed between power supply lines, each of the power supply lines in a row of a word line group is shared by an adjacent row in the word line group, wherein a row on a boundary of a word line group has a power supply line shared by a row on a boundary of an adjacent word line group;
   word line decoder circuitry associated with each of the predetermined word line groups that is configured to activate one of the word lines in a word line group in response to a decoding address selecting a row in that word line group; and
   a power supply line driver device associated with each of the predetermined word line groups that is configured to control a local power supply provided to all of the power supply lines in a word line group and all of the word line decoder circuitry associated with that word line group.

3. The device according to claim 2, wherein the word line decoder circuitry associated with each of the predetermined word line groups comprises a plurality of word line drivers each configured to drive a word line in a row of a word line group.

4. The device according to claim 3, wherein the word line decoder circuitry associated with each of the predetermined word line groups further comprises a plurality of word line decoders each configured to activate one of the plurality of word line drivers in a word line group.

5. The device according to claim 4, wherein the word line decoder circuitry associated with each of the predetermined word line groups further comprises a word line group pre-decoder configured to initiate activation of one of the word lines in a word line group by generating a decoding address that selects one of the word line decoders in the word line group to drive a word line driver that selects the word line.

6. The device according to claim 5, wherein each word line group pre-decoder is configured to cause the power supply line driver in the word line group to activate the local power supply to provide a full power voltage to all of the power supply lines in the word line group upon generating the decoding address selecting one of the word lines in the word line group.

7. The device according to claim 6, wherein each word line group pre-decoder is configured to cause the power supply line driver in an adjacent word line group to activate the local power supply associated therewith to provide a full power voltage to all of the power supply lines in the adjacent word line group upon generating the decoding address except for one row that is on a boundary with another word line group that is at a half-powered voltage value.

8. The device according to claim 2, wherein the power supply line driver device associated with each of the predetermined word line groups comprises a P-type field effect transistor (PFET) header comprising a predetermined number of PFETs that corresponds with the number of word lines in the word line group, each gate of the PFETs in the PFET header are tied together and each drain of the PFETs in the PFET header are tied together, forming a group of PFETs that serves as a voltage domain for all of the power supply lines in a word line group.

9. The device according to claim 8, wherein the power supply line driver device associated with each of the predetermined word line groups further comprises an N-type field effect transistor (NFET) selection device that is configured to activate the PFET header in the word line group to supply the local power supply to all of the power supply lines in the word line group, the NFET selection device being activated from one of a pre-decoding address generated within the word line group and another pre-decoding address generated from an adjacent word line group.

10. The device according to claim 9, wherein the PFET header of each word line group is configured to activate all power supply lines in the word line group to a full power voltage value in response to one of the pre-decoding address generated from within the word line group and the pre-decoding address generated from the adjacent word line group.

11. The device according to claim 10, wherein a PFET header of an adjacent word line group is configured to activate all power supply lines in the word line group associated therewith to a full power voltage value in response to one of a pre-decoding address generated from within that word line group and a pre-decoding address generated from an adjacent word line group.

12. The device according to claim 11, where all other power supply lines in other word line groups in the memory array are at a power-gated voltage value while the power supply lines in the word line group with the selected row and the power supply lines of the adjacent word line group are at a full power voltage value except for one row in the adjacent word line on a boundary with another word line group that is at a half-powered voltage value.

13. A circuit, comprising:
a memory array comprising a plurality of cells arranged in rows and columns, wherein the rows of the memory array are segmented into a predetermined number of word line groups, each word line group including a plurality of rows of the memory array, each row in a word line group has a word line disposed between power supply lines, each of the power supply lines in a row of a word line group is shared by an adjacent row in the word line group, wherein a row on a boundary of a word line group has a power supply line shared by a row on a boundary of an adjacent word line group;
a plurality of word line drivers distributed across each of the predetermined word line groups, each of the plurality of word line drivers in a word line group configured to drive a word line in a row of the word line group;
a plurality of word line decoders distributed across each of the predetermined word line groups, each of the plurality of word line decoders in a word line group configured to activate one of the plurality of word line drivers in the word line group;
a power supply line driver device distributed across each of the predetermined word line groups, each power supply line driver in a word line group configured to control a local power supply provided to all of the power supply lines in the word line group and all of the word line drivers in the word line group; and
a word line group pre-decoder associated with each of the predetermined word line groups, each word line group pre-decoder in a word line group configured to generate a pre-decoding address that activates all power supply lines in the word line group to a full power voltage value and all power supply lines in an adjacent word line group to a full power voltage value except for one row in the adjacent word line on a boundary with another word line group that is at a half-powered voltage value, while all other power supply lines in other word line groups in the memory array are at a power-gated voltage value.

14. The circuit according to claim 13, wherein the pre-decoding address is sent to one of the word line decoders in the word line group to drive a word line driver that selects a row of the memory array.

15. The circuit according to claim 13, wherein each power supply line driver device in a word line group comprises a P-type field effect transistor (PFET) header including a predetermined number of PFETs that corresponds with the number of word lines in the word line group, wherein each gate of the PFETs in the PFET header are tied together and each drain of the PFETs in the PFET header are tied together, forming a group of PFETs that serves as a voltage domain for all of the power supply lines in the word line group.

16. The circuit according to claim 15, wherein each drain of the PFETs in the PFET header of a word line group is connected to one of the word line drivers in the word line group, enabling the PFET header to control the local power supply provided to all the word line drivers in the word line group.

17. The circuit according to claim 15, wherein the control of the local power supply provided by each PFET header in a word line group includes a local power gating of all of the word line drivers of that word line group.

18. The circuit according to claim 15, wherein each power supply line driver device in a word line group further includes an N-type field effect transistor (NFET) selection device that is configured to activate the PFET header in the word line group to supply the local power supply to all of the power supply lines in the word line group.

19. The circuit according to claim 18, wherein the NFET selection device of each word line group is activated upon receiving a pre-decoding address generated from a word line group pre-decoder associated that word line group or upon receiving another pre-decoding address generated from another word line group pre-decoder in an adjacent word line group.

20. The circuit according to claim 13, wherein each of the power supply lines in a row of a word line group is in parallel with the word line associated with the row.

21. The circuit according to claim 13, wherein the predetermined number of word line groups segmented into the rows of the memory array comprises four word lines per word line group.

* * * * *